US010636492B2

(12) United States Patent
Baek et al.

(10) Patent No.: US 10,636,492 B2
(45) Date of Patent: Apr. 28, 2020

(54) MEMORY DEVICE HAVING PLURALITY OF MEMORY CELL STRINGS, PLURALITY OF SOURCE SELECT TRANSISTORS AND PLURALITY OF DRAIN SELECT TRANSISTORS AND METHOD OF OPERATING A MEMORY DEVICE HAVING IMPROVED THRESHOLD VOLTAGE DISTRIBUTIONS OF SELECT TRANSISTORS

(71) Applicant: SK hynix Inc., Gyeonggi-do (KR)

(72) Inventors: Kwang Ho Baek, Gyeonggi-do (KR); Jong Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/050,913

(22) Filed: Jul. 31, 2018

(65) Prior Publication Data
US 2019/0189216 A1    Jun. 20, 2019

(30) Foreign Application Priority Data
Dec. 18, 2017    (KR) .................. 10-2017-0174473

(51) Int. Cl.
| | | |
|---|---|---|
| G11C 16/04 | (2006.01) | |
| G11C 16/10 | (2006.01) | |
| G11C 16/34 | (2006.01) | |
| G11C 16/08 | (2006.01) | |
| G11C 11/56 | (2006.01) | |
| G11C 16/14 | (2006.01) | |

(52) U.S. Cl.
CPC .......... *G11C 16/10* (2013.01); *G11C 11/5628* (2013.01); *G11C 16/08* (2013.01); *G11C 16/14* (2013.01); *G11C 16/3459* (2013.01); *G11C 16/0483* (2013.01)

(58) Field of Classification Search
CPC .................................................. G11C 11/5628
USPC ........... 365/185.03, 185.05, 185.171, 185.19
See application file for complete search history.

(56) References Cited

U.S. PATENT DOCUMENTS

| | | | |
|---|---|---|---|
| 9,305,652 B2 * | 4/2016 | Kim ..................... | G11C 16/107 |
| 2010/0118606 A1 * | 5/2010 | Lee ...................... | G11C 11/5628 |
| | | | 365/185.03 |

(Continued)

FOREIGN PATENT DOCUMENTS

| | | |
|---|---|---|
| KR | 1020130050589 | 5/2013 |
| KR | 1020160022627 | 3/2016 |

*Primary Examiner* — Connie C Yoha
(74) *Attorney, Agent, or Firm* — IP & T Group LLP

(57) ABSTRACT

A method of operating a memory device having improved threshold voltage distributions of select transistors, the memory device including a plurality of cell strings each including a plurality of source select transistors, a plurality of memory cells, and a plurality of drain select transistors stacked in a vertical direction to a substrate include performing a first program operation to program at least one source select transistor coupled to a first source select line adjacent to a common source line, among the plurality of source select transistors, using a fixed program voltage, and performing a second program operation to program at least one source select transistor coupled to a second source select line adjacent to the first source select line, among the plurality of source select transistors, using an incremental step pulse program (ISPP) method after the first program operation is completed.

25 Claims, 9 Drawing Sheets

(56) References Cited

U.S. PATENT DOCUMENTS

2011/0249503 A1* 10/2011 Yamada ............. G11C 16/0483
                                                          365/185.19
2016/0071596 A1*  3/2016 Lee ....................... G11C 16/10
                                                          365/185.22

* cited by examiner

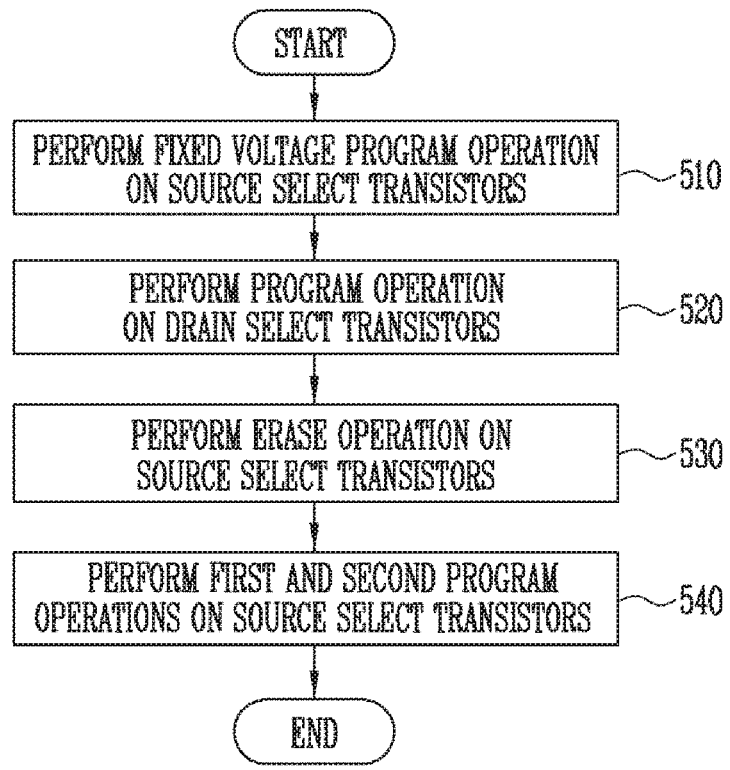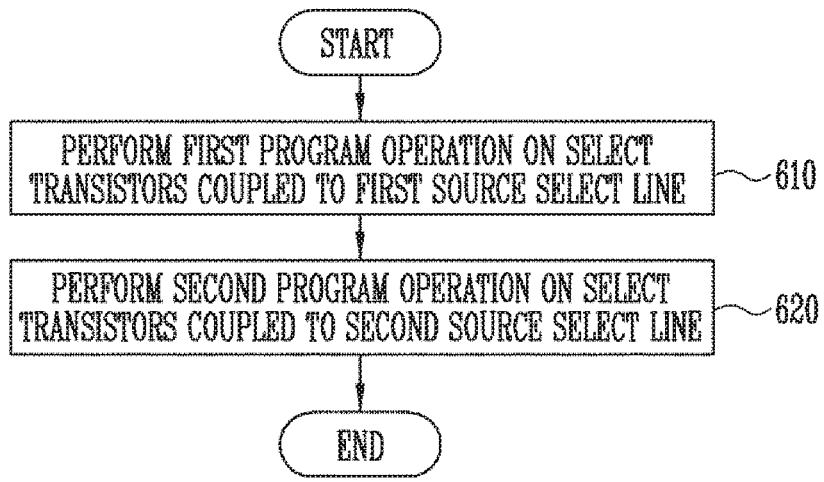

| Line | voltage |
|---|---|
| BL | Vss |
| DSL | Vss |
| WL1 ~ WLn | Vss |
| SSL2 | Vss |
| SSL1 | Vpgm(Fixed) |
| CSL | Vss |

MEMORY DEVICE HAVING PLURALITY OF MEMORY CELL STRINGS, PLURALITY OF SOURCE SELECT TRANSISTORS AND PLURALITY OF DRAIN SELECT TRANSISTORS AND METHOD OF OPERATING A MEMORY DEVICE HAVING IMPROVED THRESHOLD VOLTAGE DISTRIBUTIONS OF SELECT TRANSISTORS

CROSS-REFERENCE TO RELATED APPLICATION

The present application claims priority under 35 U.S.C. § 119(a) to Korean patent application number 10-2017-0174473, filed on Dec. 18, 2017, the entire disclosure of which is incorporated herein by reference in its entirety.

BACKGROUND

Field of Invention

Various embodiments of the invention relate generally to an electronic device and, more particularly, to a memory device and an operating method thereof.

Description of Related Art

A semiconductor memory device is a memory device embodied by using semiconductors such as silicon (Si), germanium (Ge), gallium arsenide (GaAs), and indium phosphide (InP). Semiconductor memory devices are classified into volatile memory devices and non-volatile memory devices.

Examples of nonvolatile memories include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

SUMMARY

Various embodiments of the present invention are directed to a memory device having improved threshold voltage distributions of select transistors and an operating method thereof.

In accordance with an embodiment, a method of operating a memory device is provided wherein the memory device may include a plurality of cell strings each including a plurality of source select transistors, a plurality of memory cells, and a plurality of drain select transistors stacked in a vertical direction to a substrate. The method may include programming the plurality of drain select transistors, programming one or more first source select transistors, among the plurality of source select transistors, using a fixed program voltage, and programming at least one second source select transistor using an incremental step pulse program (ISPP) method, wherein the at least one second source select transistor is a remaining source select transistor other than the one or more first source select transistors.

In accordance with an embodiment of the invention, a memory device may include a memory cell array including a plurality cell strings including a plurality of source select transistors coupled in series to a common source line, at least one drain select transistor coupled to a bit line, and a plurality of memory cells coupled between the at least one drain select transistor and the plurality of source select transistors, a peripheral circuit performing a program operation on the plurality of source select transistors, and a control logic controlling the peripheral circuit to program one or more first source select transistors, among the plurality of source select transistors, using a fixed program voltage, and to program second source select transistors among the plurality of source select transistors, using an incremental step pulse program (ISPP) method during the program operation, wherein the second source select transistors are remaining select transistors other than the one or more first source select transistors.

In accordance with an embodiment of the invention, a memory device may include a memory cell array including a plurality of cell strings each including a plurality of source select transistors, a plurality of memory cells, and a plurality of drain select transistors stacked in a vertical direction to a substrate, a peripheral circuit performing a program operation on the plurality of source select transistors and the plurality of drain select transistors, and a control logic controlling the peripheral circuit during the program operation to perform a program operation on the plurality of source select transistors, perform a program operation on the plurality of drain select transistors, perform an erase operation on source select transistors included in at least one selected cell string, among the plurality of cell strings after the program operation is performed on the plurality of drain select transistors, program source select transistors coupled to a first source select line, among the source select transistors included in the at least one selected cell string, using a fixed program voltage, and program source select transistors coupled to a second source select line using an incremental step pulse program (ISPP) method.

These and other features and advantages of the present invention will become apparent to those with ordinary skill in the art to which the present invention belongs from the following description in conjunction with the accompanying drawings.

BRIEF DESCRIPTION OF THE DRAWINGS

FIG. 5 is a flowchart illustrating a program operation of select transistors of a memory device in accordance with an embodiment;

FIG. 6 is a flowchart illustrating a program operation of select transistors in accordance with an embodiment;

DETAILED DESCRIPTION

Figure 1:
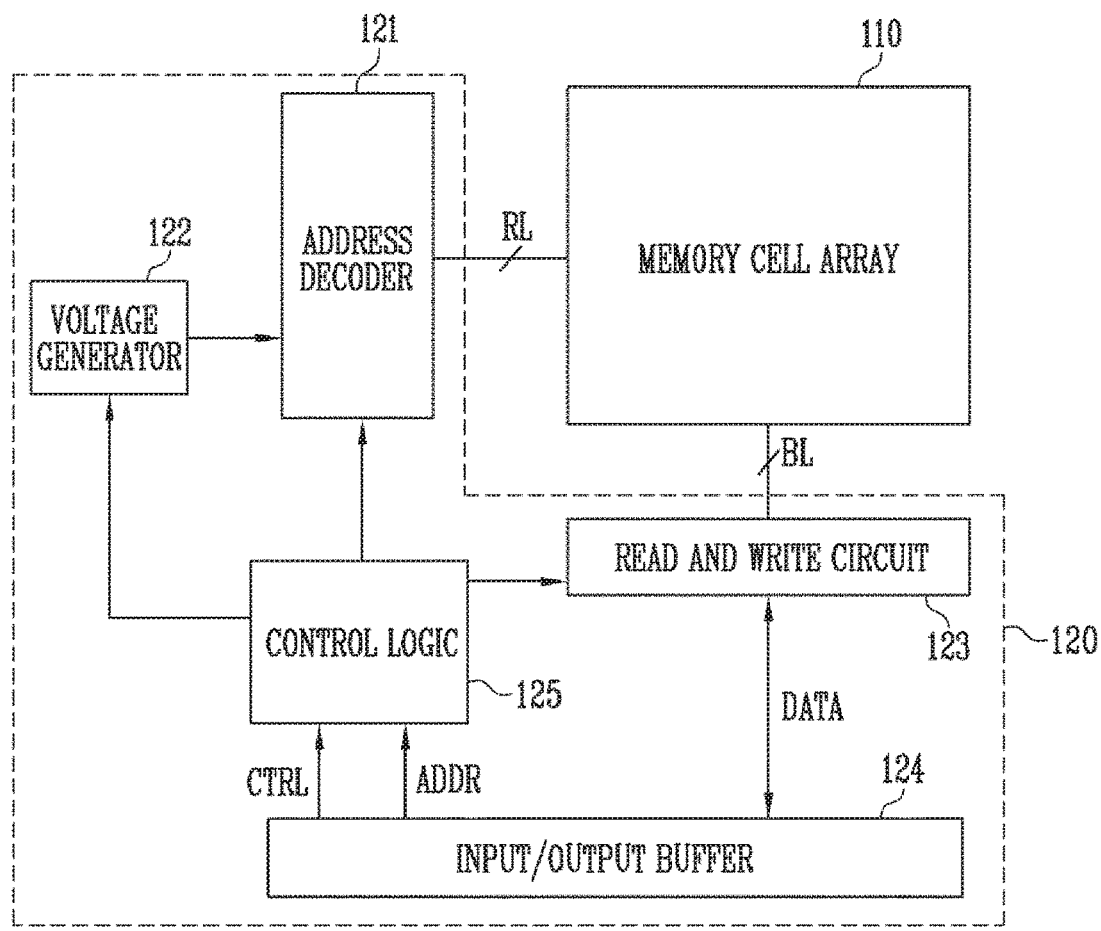
FIG. 1 is a simplified block diagram illustrating a memory device.

Hereinafter the present invention is described by specific embodiments, however, it is noted that the invention is not limited to the specific embodiments and may be implemented in various other embodiments and variations thereof without departing from the spirit and scope of the present invention.

Various modifications and changes may be applied to the described embodiments illustrated in the drawings and described in the specification in accordance with the concepts of the present invention. Hence, the embodiments according to the concepts of the present invention should not be construed as limited to the described embodiments but may include all embodiments and changes, equivalents, or substitutes thereof that do not depart from the spirit and technical scope of the present invention.

While terms such as "first" and "second" may be used to describe various components, such components must not be understood as being limited to the above terms. The above terms are used to distinguish one component from another component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

So far as not being differently defined, all terms used herein including technical or scientific terminologies should have the meanings understood by those skilled in the art to which the present disclosure pertains in view of the present disclosure. The terms defined in generally used dictionaries should be construed as having the same meanings as would be construed in the context of the present disclosure and related art.

In some embodiments, well-known processes, device structures, and technologies will not be described in detail to avoid ambiguousness of the present invention. This intends to disclose the gist of the present disclosure more clearly by omitting unnecessary description.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, exemplary embodiments of the present disclosure will be described in detail with reference to the accompanying drawings to enable those skilled in the art to implement the technical spirit of the present disclosure without undue experimentation.

FIG. 1 is a simplified block diagram illustrating a semiconductor memory device 100.

Referring to FIG. 1, the semiconductor memory device 100 may include a memory cell array 110 and a peripheral circuit 120.

Examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM).

In an embodiment, the memory device 100 may have a three-dimensional (3D) array structure. In an embodiment, the memory device may be a three-dimensional flash memory. The flash memory may employ a charge storage layer including a conductive floating gate (FG), or may be a charge trap flash (CTF) memory in which a charge storage layer includes an insulating layer.

The memory cell array 110 may be coupled to an address decoder 121 through row lines RL. The memory cell array 110 may be coupled to a read and write circuit 123 through bit lines BL.

Figure 2:
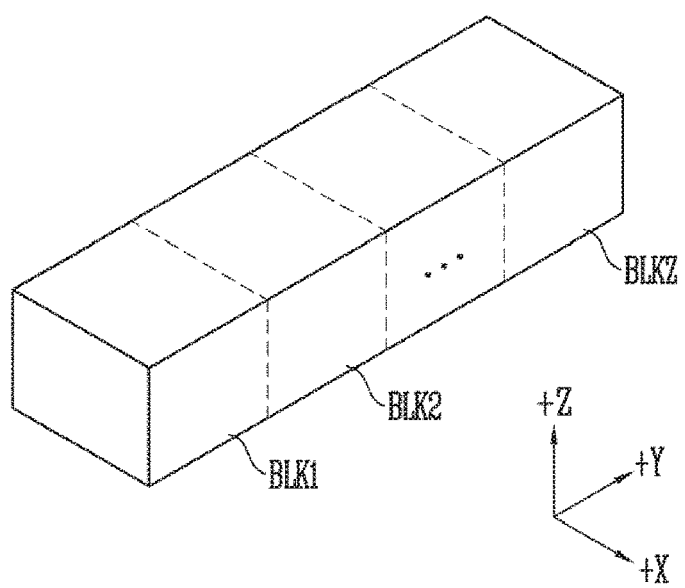
FIG. 2 is a simplified block diagram illustrating an embodiment of a memory cell array shown in FIG. 1.

The memory cell array 110 may include a plurality of memory blocks BLK1 to BLKz (See FIG. 2). Each of the plurality of memory blocks BLK1 to BLKz may include a plurality of cell strings CS11 to CS2$m$ (See FIG. 3). Each of the plurality of cell strings CS11 to CS2$m$ may include a plurality of memory cells MC1 to MCn stacked over a substrate. In accordance with an embodiment, the plurality of memory cells may be nonvolatile memory cells.

Among the plurality of memory cells, memory cells coupled to the same word line are defined as one page. In other words, the memory cell array 110 may include a plurality of pages organized in a plurality of memory blocks BLK1 to BLKz. In an embodiment, each of the plurality of memory blocks BLK1 to BLKz included in the memory cell array 110 may include a plurality of dummy cells. One or more dummy cells may be coupled in series between a drain select transistor and the memory cells in a cell string and/or between a source select transistor and the memory cells in a cell string.

In accordance with an embodiment, each of the memory cells may be a single-level cell (SLC) storing a single data bit, a multi-level cell (MLC) storing two data bits, a triple-level cell (TLC) storing three data bits, or a quad-level cell (QLC) storing four data bits. An exemplary configuration of the memory cell array 110 will be described in more detail with reference to FIGS. 2 to 4.

The peripheral circuit 120 may include the address decoder 121, a voltage generator 122, the read and write circuit 123, an input/output buffer 124, and a control logic 125.

The address decoder 121 may be coupled to the memory cell array 110 through the row lines RL. The row lines RL may include drain select lines, word lines, source select lines, and a common source line.

The address decoder 121 may be controlled by the control logic 125 and configured to control the row lines RL. The address decoder 121 may receive an address ADDR from the control logic 125.

During a program operation and a read operation, the address ADDR may include a block address and a row address. The address decoder 121 may be configured to decode the block address of the received address ADDR. The address decoder 121 may select at least one memory block according to the decoded block address. The address decoder 121 may be configured to decode the row address of the received address ADDR. The address decoder 121 may select one of drain select lines of a selected memory block according to the decoded row address and select one of the plurality of word lines of the selected memory block. Therefore, memory cells corresponding to one page may be selected.

In accordance with an embodiment, during an erase operation, the address ADDR may include a block address. The address decoder 121 may decode the block address and select one memory block according to the decoded block address.

In accordance with an embodiment, the memory device 100 may program select transistors coupled to the source select lines. Therefore, threshold voltages of the source select transistors may be controlled to a predetermined target level. During a program operation on the source select transistors, the address decoder 121 may provide a program voltage to a selected source select line in response to control of the control logic 125.

In accordance with an embodiment, the address decoder 121 may include a block decoder for decoding the block address, a row decoder for decoding the row address and an address buffer. (Not shown).

The voltage generator 122 may be controlled by the control logic 125. The voltage generator 122 may generate an internal power voltage by using an external power voltage provided to the memory device 100. For example, the voltage generator 122 may generate the internal power voltage by regulating the external power voltage. The internal power voltage may be provided to the address decoder 121, the read and write circuit 123, the input/output buffer 124 and the control logic 125 and used as an operation voltage of the semiconductor memory device 100.

The voltage generator 122 may generate a plurality of voltages by using at least one of the external power voltage and the internal power voltage. In accordance with an embodiment, the voltage generator 122 may include a plurality of pumping capacitors receiving the internal power voltage and generating a plurality of voltages by selectively activating one or more of the plurality of pumping capacitors in response to control of the control logic 125. For example, the voltage generator 122 may generate various voltages to be applied to the row lines RL and provide the generated voltages to the address decoder 121.

The read and write circuit 123 may be coupled to the memory cell array 110 through the bit lines BL. The read and write circuit 123 may be controlled by the control logic 125.

During an erase operation, the read and write circuit 123 may float the bit lines BL. During a program operation, the read and write circuit 123 may transfer data DATA from the input/output buffer 124 to the bit lines BL. Selected memory cells may be programmed according to the transferred data DATA. During a read operation, the read and write circuit 123 may read the data DATA from the selected memory cells through the bit lines BL and output the read data DATA to the input/output buffer 124.

In accordance with an embodiment, the memory device 100 may program source select transistors coupled to the source select lines. During a program of the source select transistors, the read and write circuit 123 may apply a program permission voltage or a program inhibition voltage to the bit lines BL depending on a string to program. When a bit line receives a program permission voltage, a threshold voltage of a corresponding source select transistor may increase. When a bit line receives a program inhibition voltage, a threshold voltage of a corresponding source select transistor may be maintained.

In accordance with an embodiment, the read and write circuit 123 may include page buffers (or page registers) and a column selection circuit.

The control logic 125 may be coupled to the address decoder 121, the voltage generator 122, the read and write circuit 123, and the input/output buffer 124. The control logic 125 may receive a control signal CTRL and the address ADDR from the input/output buffer 124. The control logic 125 may be configured to control general operations of the memory device 100 in response to the control signal CTRL. The control logic 125 may transfer the address ADDR to the address decoder 121.

The input/output buffer 124 may receive the control signal CTRL and the address ADDR from an external device and transfer the received control signal CTRL and address ADDR to the control logic 125. In addition, the input/output buffer 124 may be configured to transfer the externally input data DATA to the read and write circuit 123 and output the data DATA received from the read and write circuit 123 to an external device.

FIG. 2 is a simplified block diagram illustrating an embodiment of the memory cell array 110 shown in FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate. The plurality of memory cells may be arranged in X direction, Y direction and Z direction. Hereinbelow, in the accompanying drawings, a direction vertically projecting from the top surface of a substrate is defined as the Z direction, and two directions parallel to the top surface of the substrate and intersecting with each other are defined as the X and Y directions, respectively. The Y direction may correspond to the extending direction of bit lines, and the X direction may correspond to the extending direction of the row lines. The X and Y directions may intersect substantially perpendicular to each other. In the drawings, a direction indicated by an arrow and a direction opposite thereto represent the same direction.

An example of the structure of each memory block will be described in more detail with reference to FIG. 3.

Figure 3:
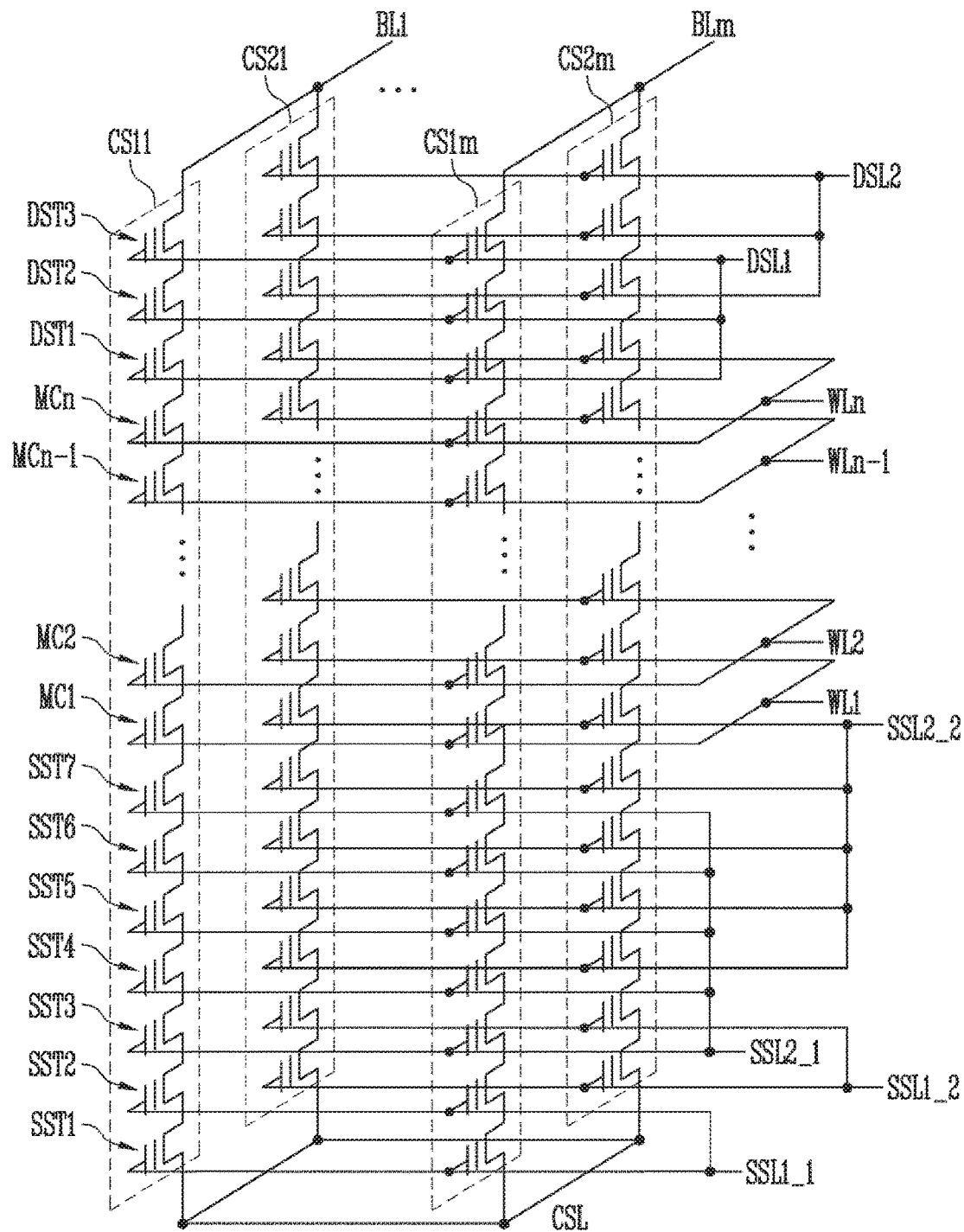
FIG. 3 is a circuit diagram illustrating one of a plurality of memory blocks shown in FIG. 2.

FIG. 3 is a circuit diagram illustrating an exemplary configuration of one (BLK1) of the memory blocks BLK1 to BLKz of FIG. 2.

Referring to FIG. 3, the first memory block BLK1 may include a plurality of cell strings CS11 to CS1m and CS21 to CS2m. Each of the plurality of cell strings CS11 to CS1m and CS21 to CS2m may extend in the Z direction. In the first memory block BLK1, m cell strings may be arranged in a row direction (i.e., the X direction). For convenience of explanation, as shown in FIG. 3, only two cell strings are arranged in a column direction (i.e., the Y direction). However, it is understood that three or more cell strings may be arranged in the column direction.

Each of the plurality of cell strings CS11 to CS1m and CS21 to CS2m may include first to seventh source select transistors SST1 to SST7, first to nth memory cells MC1 to MCn, and first to third drain select transistors DST1 to DST3 which are stacked on a substrate (not shown) under the memory block BLK1.

Each of the select transistors SST1 to SST7 and DST1 to DST3 and each of the memory cells MC1 to MCn may have similar structures to each other. In accordance with an embodiment, each of the select transistors SST1 to SST7 and DST1 to DST3 and the memory cells MC1 to MCn may include a channel layer, a tunneling insulating layer, a charge storage layer, and a blocking insulating layer. Therefore, each of the select transistors SST1 to SST7 and DST1 to DST3 and the memory cells MC1 to MCn may have a threshold voltage varying depending on the number of electrons trapped in the charge storage layer.

The source select transistors SST1 to SST7 of each cell string may be coupled in series between a common source line CSL and memory cells MC1 to MCn. Sources of the first source select transistors SST1 of the cell strings CS11 to CS1m and CS21 to CS2m may be coupled in common to the common source line CSL. In accordance with an embodiment, for example, gates of the first and second source select transistors SST1 and SST2 of the cell strings CS11 to CS1m arranged in the same row direction (X direction) may be coupled in common to a first source select line SSL1_1 extending in the row direction. The first and second source select transistors SST1 and SST2 of the cell strings CS11 to CS1m in the first row may be coupled to the first source select line SSL1_1. The first and second source select transistors SST1 and SST2 of the cell strings CS21 to CS2m in the second row may be coupled to a first source select line SSL1_2.

In accordance with an embodiment, one or more source select transistors SST1 and SST2 adjacent to the common source line CSL in a single cell string may be coupled to another source select line separate from the remaining source select transistors SST3 to SST7. For example, the first and second source select transistors SST1 and SST2 of the cell strings CS11 to CS1m in the first row may be coupled to the first source select line SSL1_1, and the third to seventh source select transistors SST3 to SST7 of the cell strings CS11 to CS1m in the first row may be coupled to a second source select line SSL2_1. The first and second source select transistors SST1 and SST2 of the cell strings CS21 to CS2m in the second row may be coupled to the first source select line SSL1_2. The third to seventh source select transistors SST3 to SST7 of the cell strings CS21 to CS2m in the second row may be coupled to the second source select line SSL2_2.

In accordance with various embodiments, the first to seventh source select transistors SST1 to SST7 of the first memory block BLK1 may be separated from each other and coupled to first to seventh source select lines (not shown) controlled independently of each other. The first to seventh source select lines (not shown) may simultaneously receive a voltage having the same level, or voltages of different levels.

In FIG. 3, seven source select transistors, i.e., SST1 to SST7 are shown. However, the number of source select transistors included in a single cell string of a memory block in accordance with an embodiment is not limited to FIG. 3. For example, a single cell string may include fewer or more than the seven source select transistors.

The first to nth memory cells MC1 to MCn of each cell string may be coupled in series between the source select transistors SST1 to SST7 and the drain select transistors DST1 to DST3. Memory cells at the same height may be coupled to the same word line. The first to nth memory cells MC1 to MCn may be coupled to first to nth word lines WL1 to WLn, respectively.

At least one drain select transistor may be provided in each cell string. The first to third drain select transistors DST1 to DST3 of each cell string may be coupled between a corresponding bit line and the memory cells MC1 to MCn.

The first to third drain select transistors DST1 to DST3 of each cell string may be coupled to the same drain select line. Drain select transistors of cell strings arranged in the same row may be coupled to a drain select line extending in the row direction. Drain select transistors of the cell strings CS11 to CS1m in the first row may be coupled to the first drain select line DSL1. Drain select transistors of the cell strings CS21 to CS2m in the second row may be coupled to the second drain select line DSL2.

In accordance with an embodiment, as shown in FIG. 3, the first to third drain select transistors DST1 to DST3 of each cell string may be coupled to a single drain select line. Alternatively, contrary to FIG. 3, the first to third drain select transistors DST1 to DST3 of each cell string may be coupled to different drain select lines.

Although FIG. 3 illustrates the three drain select transistors DST1 to DST3, the number of drain select transistors included in a single cell string of a memory block in accordance with an embodiment is not limited thereto. For example, fewer or more than the three drain select transistors may be included in a single cell string.

Cell strings arranged in the column direction may be coupled to a bit line extending in the column direction. As illustrated in FIG. 3, the cell strings CS11 and CS21 in the first column may be coupled to the first bit line BL1. The cell strings CS1m and CS2m in an mth column may be coupled to an mth bit line BLm.

Memory cells coupled to the same word line in the cell strings arranged in the row direction may form a single page. For example, memory cells coupled to the first word line WL1 in the cell strings CS11 to CS1m in the first row may constitute a single page. Memory cells coupled to the first word line WL1 in the cell strings CS21 to CS2m in the second row may constitute another page. When one of the drain select lines DSL1 and DSL2 is selected, cell strings arranged in one row direction may be selected. When one of the word lines WL1 to WLn is selected, one page may be selected from selected cell strings.

In accordance with another embodiment, even bit lines and odd bit lines may replace the first to mth bit lines BL1 to BLm. In addition, even cell strings, among the cell strings CS11 to CS1m or CS21 to CS2m arranged in the row direction, may be coupled to even bit lines, respectively, and odd cell strings, among the cell strings CS11 to CS1m or CS21 to CS2m arranged in the row direction, may be coupled to odd bit lines, respectively.

In accordance with an embodiment, at least one of the first to nth memory cells MC1 to MCn may serve as a dummy memory cell. For example, one or more dummy memory cells may be provided to reduce an electric field between the source select transistors SST1 to SST7 and the memory cells MC1 to MCn. Alternatively, one or more dummy memory cells may be provided to reduce an electric field between the drain select transistors DST1 to DST3 and the memory cells MC1 to MCn. As more dummy memory cells are provided, the operational reliability of the memory block BLK1 may be improved, while the size of the memory block BLK1 may be increased. As fewer dummy memory cells are provided, the size of the memory block BLK1 may be reduced, while the operational reliability of the memory block BLK1 may be deteriorated.

In order to efficiently control at least one dummy memory cell, the respective dummy memory cells may have required threshold voltages. Before or after an erase operation of the memory block BLK1, program operations may be performed on all or some of the dummy memory cells. When an erase operation is performed after a program operation is performed, the dummy memory cells may have required threshold voltages by controlling the voltages applied to the dummy word lines coupled to the respective dummy memory cells.

The memory device 100 as shown in FIG. 1 may electrically connect or disconnect the memory cells MC1 to MCn to or from the common source line CSL by controlling the source select transistors SST1 to SST7. When the threshold voltages of the source select transistors SST1 to SST7 are very different from a desired voltage distribution, the source select transistors SST1 to SST7 may not be effectively controlled.

For example, when the source select transistors SST1 to SST7 have greater threshold voltages than a desired voltage distribution, then when an arbitrary operation is performed by turning on the source select transistors SST1 to SST7, a current flowing toward the common source line CSL through the source select transistors SST1 to SST7 is undesirably reduced. In other words, the amount of current flowing toward the common source line CSL through the cell string is reduced.

When the source select transistors SST1 to SST7 have lower threshold voltages than a desired threshold voltage distribution, then when an arbitrary operation is performed by turning off the source select transistors SST1 to SST7, a current may inadvertently flow toward the common source line CSL through the source select transistors SST1 to SST7.

Therefore, setting reliably the threshold voltages of the source select transistors SST1 to SST7 at an effective threshold voltage is an important factor in improving the reliability of the memory device 100.

Figure 4:
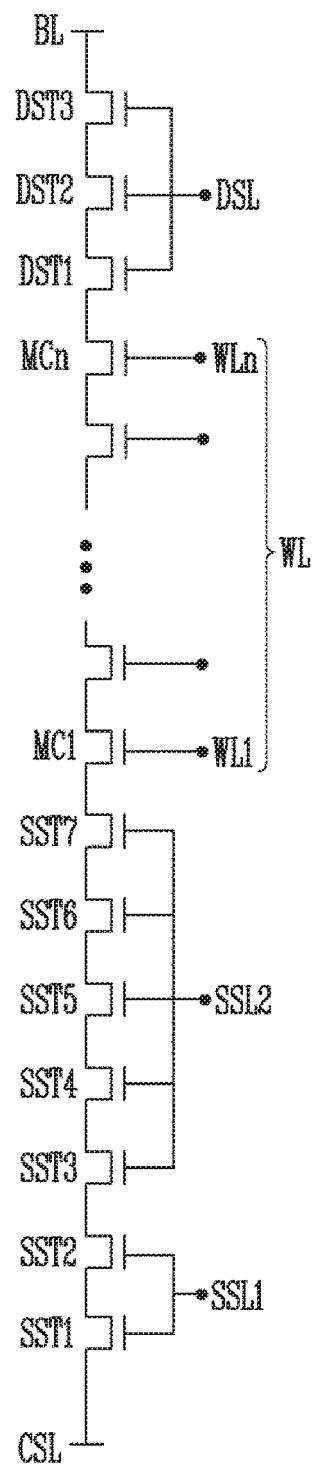
FIG. 4 is a circuit diagram illustrating a single cell string included in the memory block shown in FIG. 3.

FIG. 4 is a circuit diagram illustrating an example of one of the cell strings included in a memory block shown in FIG. 3.

Referring to FIG. 4, one cell string may include the first to seventh source select transistors SST1 to SST7, the first to nth memory cells MC1 to MCn, and the first to third drain select transistors DST1 to DST3 which are coupled in series between the common source line CSL and a bit line BL.

The first and second source select transistors SST1 and SST2, among the first to seventh source select transistors SST1 to SST7, may be coupled in common to the first source select line SSL1. The third to seventh source select transistors SST3 to SST7 may be coupled in common to the second source select line SSL2.

The first to nth memory cells MC1 to MCn may be coupled to the first to nth word lines WL1 to WLn, respectively.

The first to third drain select transistors DST1 to DST3 may be coupled in common to a drain select line DSL.

Hereinafter, for convenience of explanation, it is assumed that a memory cell array of a memory device includes memory blocks including the cell strings shown in FIG. 4.

FIG. 5 is a flowchart illustrating a program operation of select transistors of the memory device 100.

Referring to FIG. 5, at step S510, the memory device 100 may perform a fixed voltage program operation on source select transistors included in a single memory block. For example, the memory device 100 may program first to seventh source select transistors by applying a program voltage having a fixed voltage level to gates of the first to seventh source select transistors included in a selected memory block. In accordance with an embodiment, a program voltage may be applied a plurality of times without a separate program verify operation. When step S510 is performed, the source select transistors SST1 to SST7 may have threshold voltages having a predetermined level.

At step S520, the memory device 100 may perform a program operation on the drain select transistors DST1 to DST3 by applying a program voltage to the drain select line DSL. When step S520 is performed, the drain select transistors DST1 to DST3 may have threshold voltages greater than a predetermined voltage.

At step S530, the memory device 100 may perform an erase operation on the source select transistors. In accordance with an embodiment, the memory device 100 may perform an erase operation on some of the source select transistors included in one memory block. For example, when a selected memory block includes four cell strings, the memory device 100 may perform an erase operation on two of the four cell strings. The memory device 100 may apply 0V to gates of the first to seventh source select transistors SST1 to SST7 included in a memory cell string to erase and apply a high erase voltage to the common source line CSL to increase a potential of a channel, so that the first to seventh source select transistors SST1 to SST7 may be erased. When step S530 is performed, the threshold voltages of the first to seventh source select transistors SST1 to SST7 may be reduced.

At step S540, the memory device 100 may perform first and second program operations on the source select transistors SST1 to SST7 included in the erased memory cell string. For example, the first program operation may be performed on the source select transistor SST1 and SST2 coupled to the first source select line SSL1. The second program operation may be performed on the source select transistors SST3 to SST7 coupled to the second source select line SSL2. During the second program operation, since the first to seventh select transistors SST1 to SST7 included in the memory cell strings which are not erased at step S530 are programmed using a fixed program voltage at step S510, the first to seventh source select transistors SST1 to SST7 may be turned off to program-inhibit the corresponding memory cell strings.

In accordance with an embodiment, the first program operation may be performed using a program voltage having a fixed voltage level, and the second program operation may be programmed using an incremental step pulse program (ISPP) method. Step S540 will be described in detail with reference to FIGS. 6 to 10 to be described below.

FIG. 6 is a flowchart illustrating a program operation of select transistors in accordance with an embodiment. FIG. 6 is a diagram illustrating step S540 of FIG. 5.

Referring to FIG. 6, the memory device 100 may perform a first program operation on select transistors coupled to the first source select line SSL1 at step S610. The first program operation may be performed using a program voltage having a fixed voltage level. A voltage applied to the first source select line SSL1 during the first program operation may be a first program voltage VPGM1.

At step S620, the memory device 100 may perform a second program operation on select transistors coupled to the second source select line SSL2. In accordance with an embodiment, the second program operation may be performed using an incremental step pulse program (ISSP) method. During the second program operation, a voltage applied to the second source select line SSL2 may be a second program voltage VPGM2. The memory device 100 may perform the second program operation by repeating a single program loop including a program voltage applying process and a program verifying process. In each reiteration of the program loop, a level of the second program voltage VPGM2 may be increased by a level of a predetermined step voltage VSTEP. By performing the program operations using the ISPP method, a threshold voltage distribution of the select transistors coupled to the second source select line SSL2 may have a smaller width than a threshold voltage distribution of the select transistors coupled to the first source select line SSL1.

Figures 7, 8:
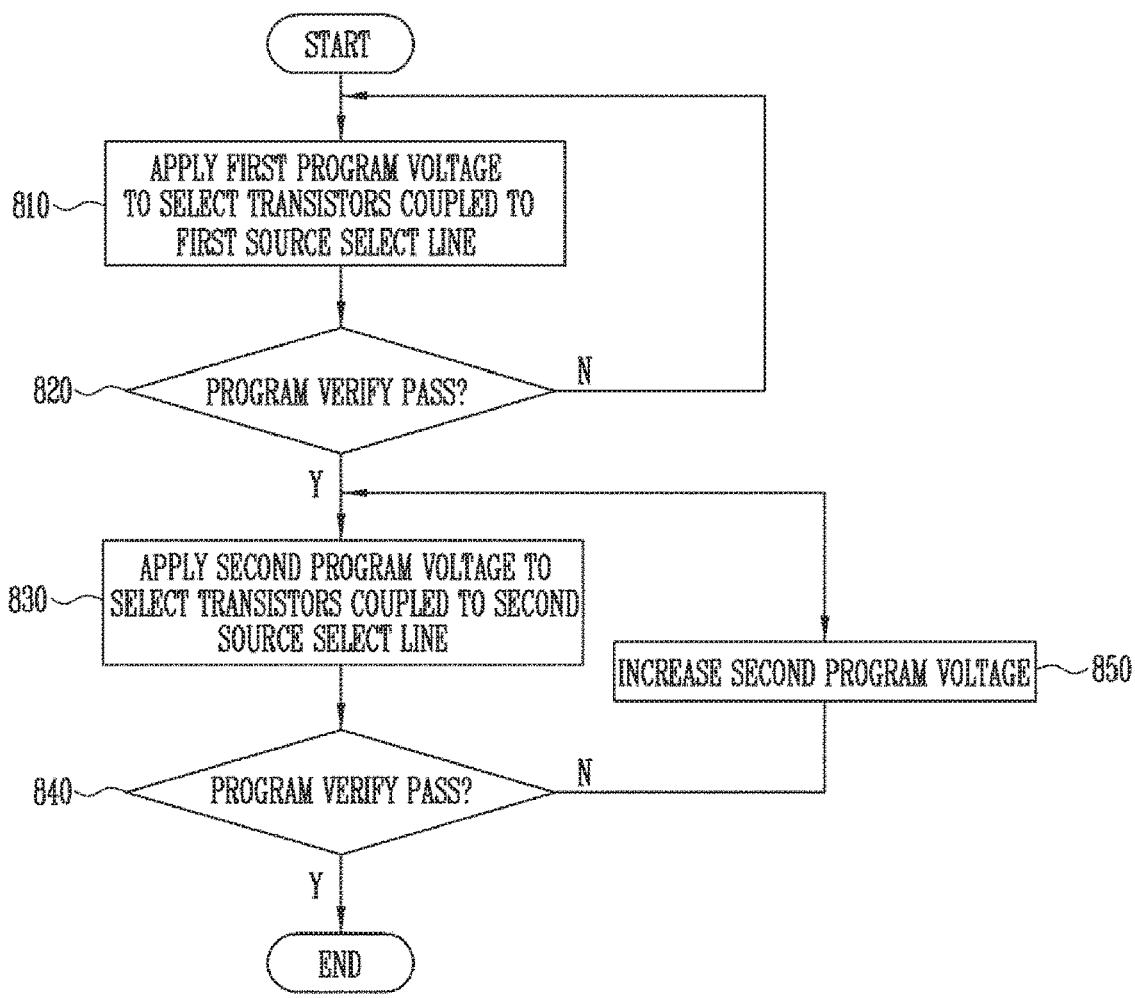
FIG. 7 is a table showing an example of the voltages applied at step S610 of FIG. 6.
FIG. 8 is a flowchart illustrating a program operation of select transistors in accordance with an embodiment.

FIG. 7 is a table showing voltages applied at step S610 of FIG. 6.

Referring to FIGS. 1 and 7, during the first program operation using the program voltage having the fixed voltage level, the voltage generator 122 of the memory device 100 may generate the first program voltage VPGM1. The first program voltage VPGM1 may correspond to the Vpgm (fixed) voltage in the table shown in FIG. 7.

Referring to the structure of the cell string shown in FIG. 4, the control logic 125 may control the voltage generator 122 and the address decoder 121 so that a reference voltage Vss may be applied to the drain select line DSL, the word lines WL1 to WLn, and the second source select line SSL2. In addition, the control logic 125 may control so that the reference voltage Vss may also be applied to the common source line CSL. In accordance with an embodiment, the reference voltage Vss may be a ground voltage. Threshold voltages of the drain select transistors DST1 to DST3, the memory cells MC1 to MCn and the source select transistors SST3 to SST7 may be maintained.

The control logic 125 may control the voltage generator 122 and the address decoder 121 so that the first program voltage VPGM1 (Vpgm(fixed)) may be applied to the first source select line SSL1. Threshold voltages of the source select transistors SST1 and SST2 coupled to the first source select line SSL1 may be increased.

FIG. 8 is a flowchart illustrating a program operation of select transistors in accordance with an embodiment.

FIG. 8 is a flowchart illustrating steps S610 and S620 of FIG. 6.

In FIG. 8, steps S810 and S820 correspond to step S610 of FIG. 6, and steps S830 to S850 correspond to step S620 of FIG. 6.

Referring to FIG. 8, at step S810, the memory device 100 may apply a first program voltage to select transistors coupled to the first source select line SSL1. The first program voltage may have a fixed voltage value. In accordance with an embodiment, the first program voltage may be applied a plurality of times.

At step S820, the memory device 100 may determine whether a program verify of the select transistors coupled to the first source select line SSL1 corresponds to a pass or a fail. For example, the memory device 100 may apply a verify voltage to gates of the select transistors coupled to the first source select line SSL1 and determine whether the program verify of the select transistors coupled to the first source select line SSL1 corresponds to the pass or the fail on the basis of changes in voltage or current output through bit lines. When the program verify is determined as a pass, the process flow proceeds to step S830, and otherwise, the process flow proceeds to step S810.

At step S830, the memory device 100 may apply a second program voltage to select transistors coupled to the second source select line SSL2. In accordance with an embodiment, the second program voltage may have a greater voltage level than that of the first program voltage.

At step S840, the memory device 100 may determine whether a program verify of the select transistors coupled to the second source select line SSL2 corresponds to a pass or a fail. For example, the memory device 100 may apply a verify voltage to gates of the select transistors coupled to the second source select line SSL2 and determine whether the program verify of the select transistors coupled to the second source select line SSL2 corresponds to the pass or the fail on the basis of changes in voltage or current output through the bit lines. When the program verify is determined as a pass, the program operation of the select transistors is terminated. When the program verify is not a pass, the process flow proceeds to step S850.

At step S850, the memory device 100 may increase the second program voltage by a predetermined step voltage. The process flow then proceeds to step S830, and the memory device 100 may apply the second program voltage having the increased voltage level to the select transistors coupled to the second source select line SSL2 again.

Figure 9:
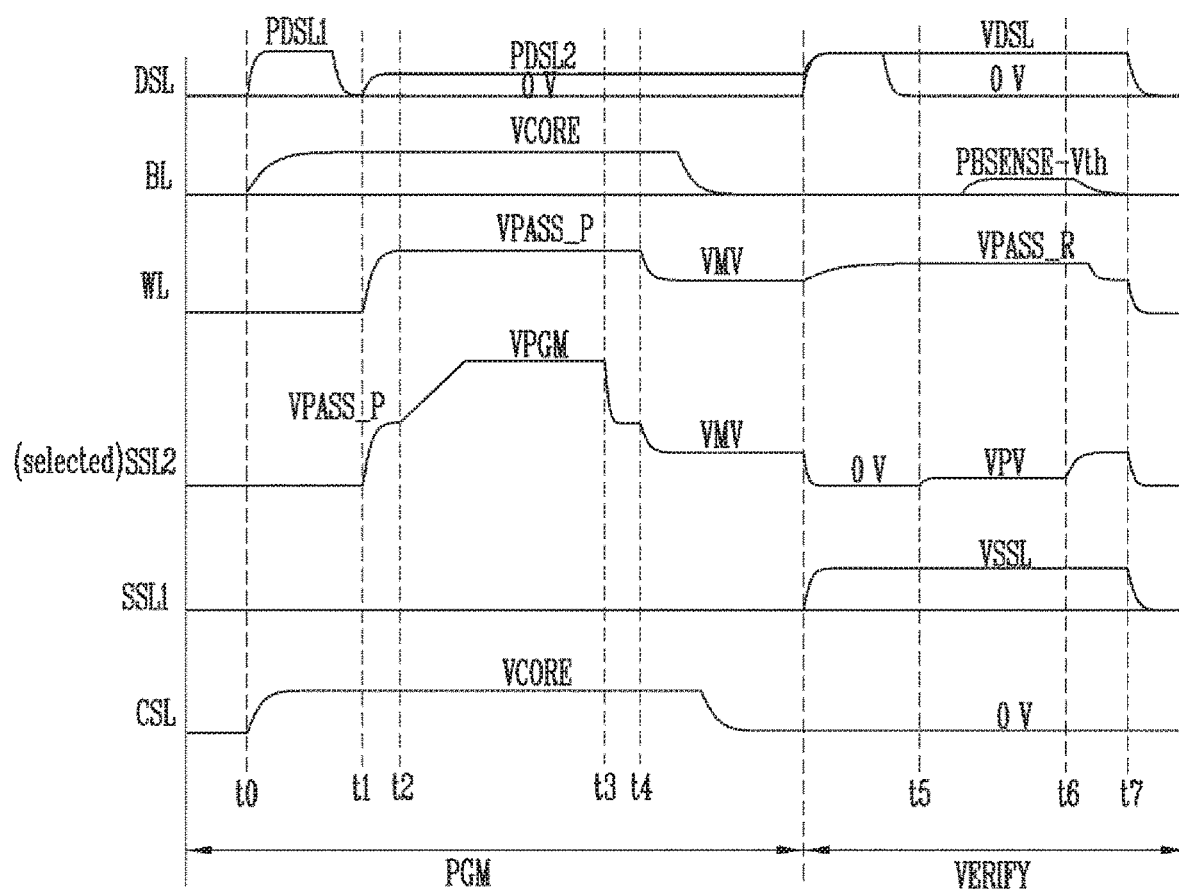
FIG. 9 is a waveform diagram illustrating voltages applied at steps S830 and S840 of FIG. 8.

FIG. 9 is a waveform diagram illustrating voltages applied at steps S830 and S840 of FIG. 8.

FIG. 9 illustrates voltages applied to respective lines in a single program loop for programming the select transistors coupled to the second source select line SSL2.

In FIG. 9, time points t0 to t5 correspond to a program voltage applying process, and time points t5 to t7 correspond to a program verifying process.

Referring to FIG. 9, during the time period from t0 to t1, a first drain select voltage PDS1 may be applied to the drain select line DSL of a selected cell string. In addition, at to, a core voltage VCORE may be coupled to the bit line BL and the common source line CSL. The first drain select voltage PDSL1 may be applied to turn on the drain select transistors DST1 to DST3. The core voltage VCORE may be applied so that a boosting voltage may be applied to a channel region of the selected cell string.

At t1, a program pass voltage VPASS_P may be applied to the selected second source select line SSL2 and the word lines WL. The program pass voltage VPASS_P may be applied to turn on the memory cells MC.

At t2, the program voltage VPGM may be applied to the second source select line SSL2. The program voltage VPGM may correspond to the second program voltage described above with reference to FIG. 8. Therefore, as the program loop is repeated, a level of the program voltage VPGM may be gradually increased.

At t3, the program pass voltage VPASS_P may be applied again to the second source select line SSL2 so as to simultaneously discharge the second source select line SSL2 and the word lines WL.

At t4, the second source select line SSL2 and the word lines WL may be discharged. Voltages of the second source select line SSL2 and the word lines WL may be reduced to a discharge voltage VMV.

After the second source select line SSL2 and the word lines WL are discharged, before t5 is reached, a drain select line voltage VDSL and a source select line voltage VSSL may be applied to the drain select line DSL and the first source select line SSL1, respectively, to verify the second source select line SSL2. The drain select line voltage VDSL and the source select line voltage VSSL may be applied to turn on the drain select transistors DST1 to DST3 and the source select transistors SST1 and SST2 coupled to the first source select line SSL1, respectively. A read pass voltage VPASS_R may be applied to the word line WL. A voltage of 0V may be applied to the common source line CSL.

At t5, a verify voltage VPV may be applied to the second source select line SSL2. When the verify voltage VPV is applied to the second source select line SSL2, a sensing voltage PBSENSE-Vth may be output to the bit line in response to threshold voltages of the select transistors SST3 to SST7 coupled to the second source select line SSL2. A program verify may be determined as a pass or a fail depending on a voltage level of the sensing voltage PBSENSE-Vth.

At t6, a voltage having the same voltage level may be applied to simultaneously discharge the second source select line SSL2 and the word lines WL. At t7, all lines may be discharged.

Figure 10A:
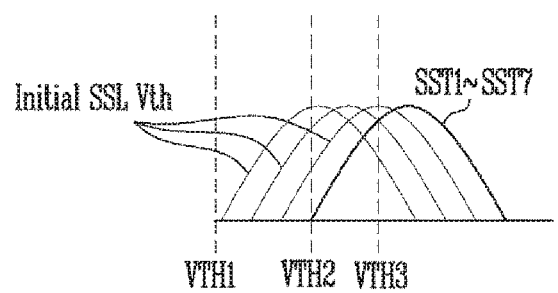
FIGS. 10A and 10B are diagrams illustrating threshold voltage distributions of select transistors in accordance with an embodiment.
Figure 10B:
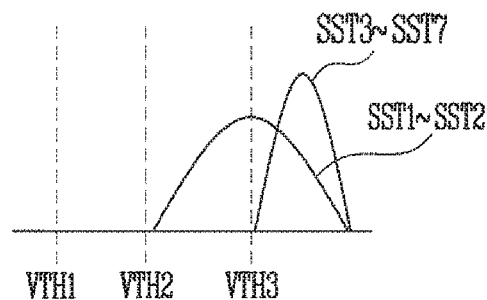

FIGS. 10A and 10B are diagrams illustrating threshold voltage distributions of programmed select transistors in accordance with an embodiment.

As shown in FIG. 10A, the first to seventh source select transistors SST1 to SST7 may be programmed by applying a program voltage having a fixed voltage level a plurality of times. As shown in FIG. 10B, after a first program operation using a program voltage having a fixed voltage level is performed on the first and second source select transistors SST1 and SST2, a second program operation is performed on the third to seventh source select transistors SST3 to SST7 by using an ISPP method.

Referring to FIG. 10A, initial threshold voltages of the source select transistors may be widely distributed around first and third threshold voltages VTH1 and VTH3. When the source select transistors are programmed by applying the program voltage having the fixed voltage level a plurality of times, all first to seventh source select transistors SST1 to SST7 may be programmed to have threshold voltages greater than a second threshold voltage VTH2. However, since the fixed voltage level is used, the widths of the threshold voltage distributions may be increased since the threshold voltages of the source select transistors are increased by different widths according to characteristics thereof.

As shown in FIG. 10B, when the first and second select transistors SST1 and SST2 coupled to the first source select line SSL1 are programmed using the program voltage having the fixed voltage level, the first and second select transistors SST1 and SST2 may be programmed to have threshold voltages greater than VTH2. Channel self boosting may be possible so as not to program source select transistors included in unselected cell strings by using the first and second source select transistors SST1 and SST2. Therefore, the third to seventh source select transistors may be programmed to have a narrower threshold voltage distribution greater than the third threshold voltage VTH3 having a higher voltage level than the second threshold voltage VTH2.

Figure 11:
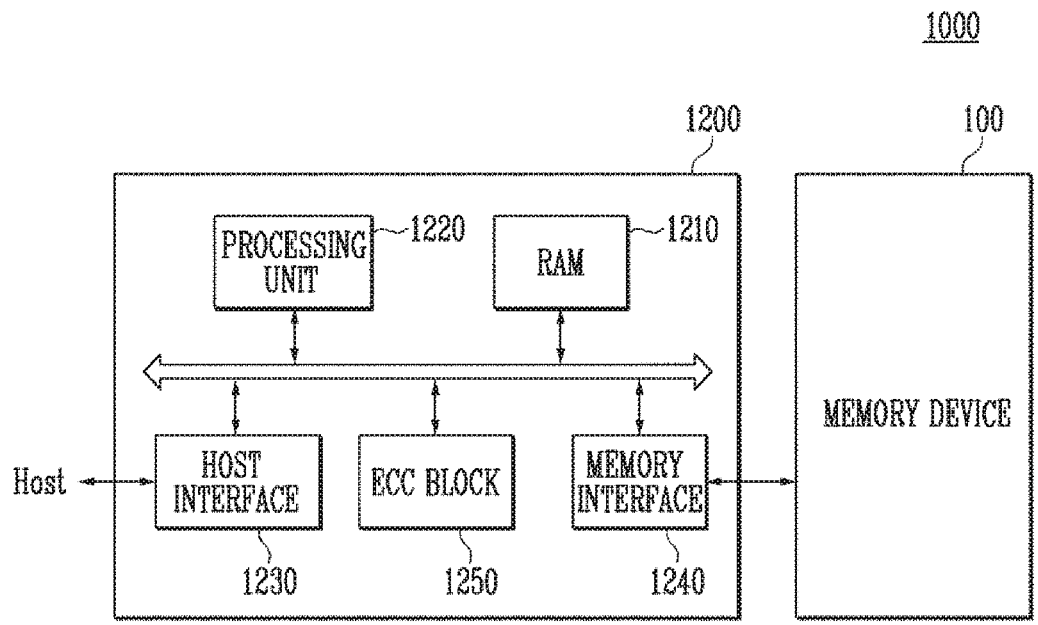
FIG. 11 is a simplified block diagram illustrating a memory system including a memory device shown in FIG. 1 in accordance with an embodiment.

FIG. 11 is a simplified block diagram illustrating a memory system 1000 including the memory device 100 described above with reference to FIG. 1.

Referring to FIG. 11, the memory system 1000 may include the memory device 100 and a controller 1200.

The memory device 100 may be configured and operated in substantially the same manner as described above with reference to FIG. 1. Hereinafter, repetitive explanations will be omitted.

The controller 1200 may be coupled to a host and the memory device 100. The controller 1200 may be configured to access the memory device 100 at the request of the host. For example, the controller 1200 may control a read operation, a program operation, an erase operation, and/or a background operation of the memory device 100. The controller 1200 may provide an interface between the memory device 100 and the host. The controller 1200 may run firmware for controlling the memory device 100.

The controller 1200 may include a random access memory (RAM) 1210, a processing unit 1220, a host interface 1230, a memory interface 1240, and an error correction block 1250.

The RAM 1210 may serve as an operation memory of the processing unit 1220, a cache memory between the semiconductor memory device 100 and the host, and/or a buffer memory between the semiconductor memory device 100 and the host.

The processing unit 1220 may control the general operation of the controller 1200.

The host interface 1230 includes a protocol for exchanging data between the host and the controller 1200. For example, the controller 1200 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1240 may interface with the memory device 100. For example, the memory interface includes a NAND interface or a NOR interface.

The error correction block 1250 may use an error correcting code (ECC) to detect and correct an error in data received from the memory device 100.

By providing the memory device 100 described with reference to FIGS. 1 to 10, the memory system 1000 having improved reliability is provided.

The controller 1200 and the memory device 100 may be integrated in one semiconductor device. In an embodiment, the controller 1200 and the semiconductor memory device 100 may be integrated into a single semiconductor device to form a memory card. For example, the controller 1200 and the memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1200 and the memory device 100 may be integrated into a single semiconductor device to form a semiconductor drive (solid state drive (SSD)). The semiconductor drive (SSD) may include a storage device configured to store data in a semiconductor memory. When the memory system 1000 serves as the semiconductor drive (SSD), operational rates of the host coupled to the memory system 1000 may be significantly improved.

In another example, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the memory device 100 or the memory system 1000 may be mounted in packages of various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 12:
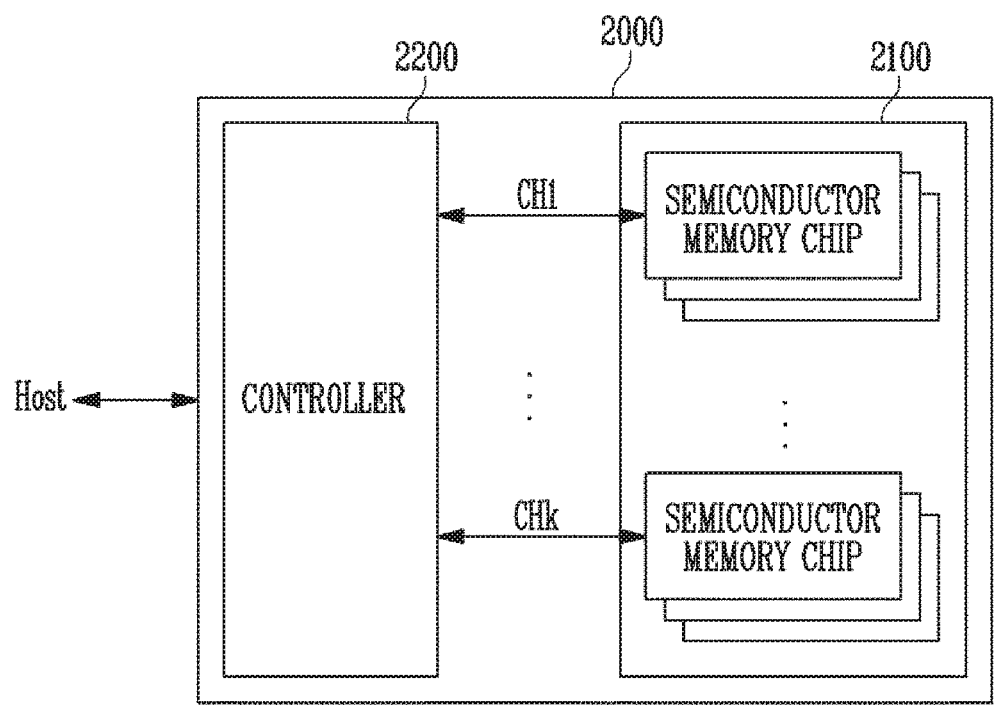
FIG. 12 is a simplified block diagram illustrating an application example of the memory system 1000 shown in FIG. 11 in accordance with an embodiment.

FIG. 12 is a simplified block diagram illustrating an application example (2000) of the memory system 1000 shown in FIG. 11.

Referring to FIG. 12, a memory system 2000 may include a memory device 2100 and a controller 2200. The memory device 2100 may include a plurality of semiconductor memory chips. The plurality of semiconductor memory chips may be divided into groups.

FIG. 12 illustrates that the plurality of groups communicate with the controller 2200 through first to kth channels CH1 to CHk, respectively. Each semiconductor memory chip may be configured and operated identically to the semiconductor memory device 100 described with reference to FIG. 1.

Each group may be configured to communicate with the controller 2200 through a single common channel. The controller 2200 may be configured in substantially the same manner as the controller 1200 described with reference to FIG. 11, and configured to control the plurality of memory chips of the memory device 2100.

FIG. 12 illustrates a plurality of semiconductor memory chips coupled to a single channel. However, the memory system 2000 may be modified so that a single memory chip may be coupled to a single channel.

Figure 13:
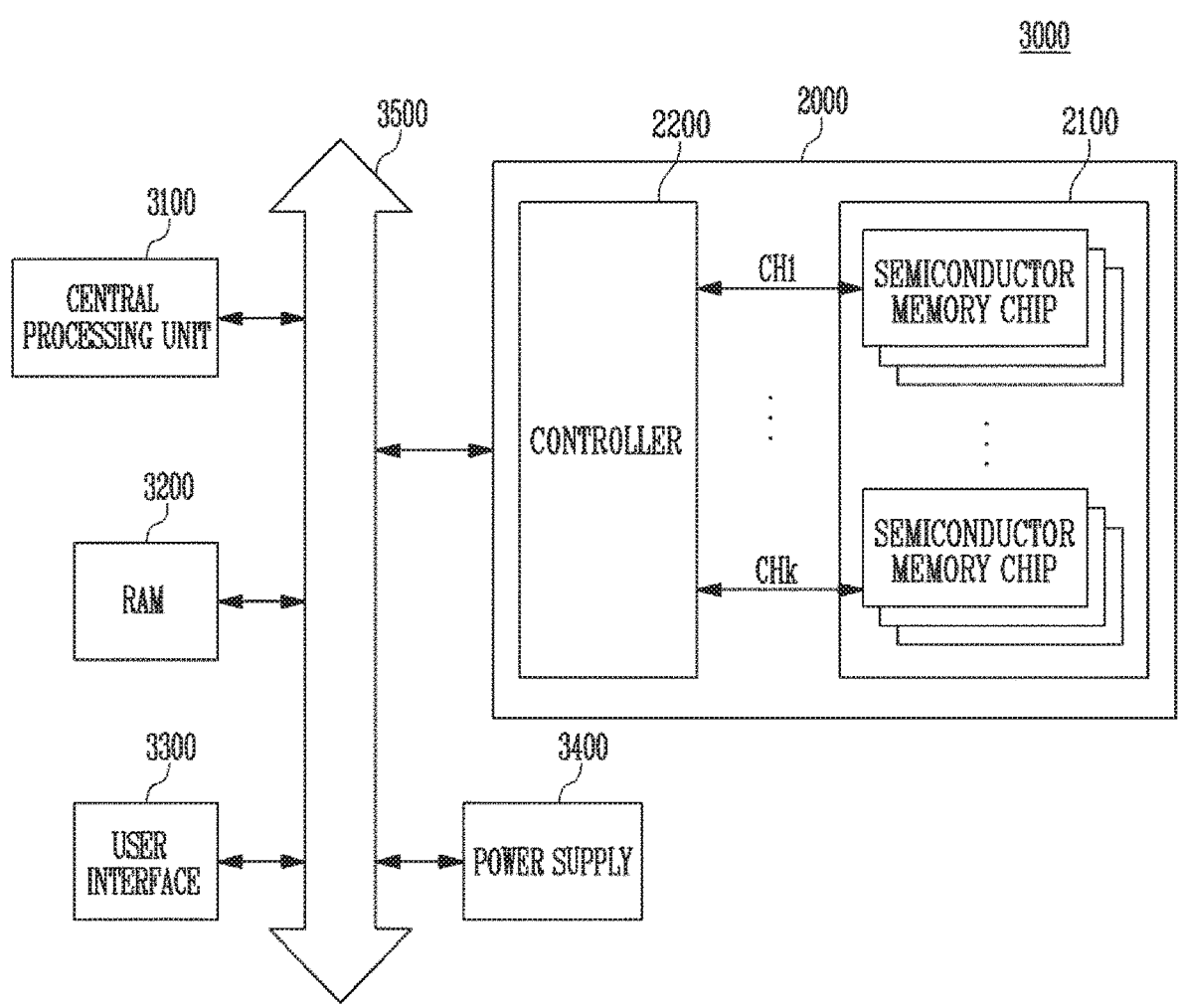
FIG. 13 is a simplified block diagram illustrating a computing system including a memory system described with reference to FIG. 12.

FIG. 13 is a simplified block diagram illustrating a computing system 3000 including the memory system 2000 described above with reference to FIG. 12.

Referring to FIG. 13, the computing system 3000 may include a central processing unit 3100, a Random Access Memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

FIG. 13 illustrates that the semiconductor memory device 2100 is coupled to the system bus 3500 through the controller 2200. However, in a variation of this embodiment, the memory device 2100 may be directly coupled to the system bus 3500 in which case the functions of the controller 2200 may be performed by the central processing unit 3100 and the RAM 3200.

FIG. 13 illustrates that the memory system 2000 described above with reference to FIG. 12 is provided. However, the memory system 2000 may be replaced with the memory system 1000 described with reference to FIG. 11. In accordance with an embodiment, the computing system 3000 may include both of the memory systems 1000 and 2000 described above with reference to FIGS. 11 and 12, respectively.

In accordance with an embodiment, at least one source select transistor of each cell string which is adjacent to a common source line may be coupled to a first source select line, and the other source select transistors may be coupled to a second source select line. The source select transistors coupled to the first source select line may be programmed using a program voltage having a fixed voltage level, and the source select transistors coupled to the second source select line may be programmed using an ISPP method, so that a program operation on the source select transistors coupled to the second source select line may be efficiently performed. Therefore, a memory system having improved reliability is provided.

In accordance with embodiments of the invention, a memory device having improved threshold voltage distributions of select transistors, and a method of operating the same are provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

Various embodiments are directed to a memory device having improved threshold voltage distributions of select transistors and an operating method thereof.

In the above-discussed embodiments, some steps may be selectively performed or skipped. In addition, the steps in each embodiment may not always be performed in regular order. Furthermore, the embodiments disclosed in the present specification and the drawings aim to help those with ordinary knowledge in this art more clearly understand the present disclosure and not to limit the bounds of the present disclosure. In other words, one of ordinary skill in the art to which the present disclosure belongs will be able to easily understand that various modifications of the described embodiments are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A method of operating a memory device including a cell string including a plurality of source select transistors, a plurality of memory cells, and a plurality of drain select transistors stacked in a vertical direction to a substrate, the method comprising:
    programming one or more first source select transistors, among the plurality of source select transistors using a fixed program voltage; and
    programming at least one second source select transistor other than the one or more first source select transistors among the plurality of source select transistors using an incremental step pulse program (ISPP) method,
    wherein threshold voltages of the one or more first source select transistors are maintained during the programming of the at least one second source select transistor.

2. The method of claim 1, wherein the one or more first source select transistors are coupled to a first source select line adjacent to a common source line, and
    the at least one second source select transistor is coupled to a second source select line adjacent to the first source select line.

3. The method of claim 2, wherein the programming of the one or more first source select transistors comprises
    performing a first program operation to program the one or more first source select transistors, and
    wherein the programming of the at least one second source select transistor comprises
    performing a second program operation to program the at least one second source select transistor after the first program operation is completed.

4. The method of claim 3, wherein the performing of the first program operation comprises providing a first program voltage corresponding to the fixed program voltage to the one or more first source select transistors coupled to the first source select line, a predetermined number of times.

5. The method of claim 3, wherein the performing of the first program operation comprises:
    applying a first program voltage corresponding to the fixed program voltage to the one or more first source select transistors coupled to the first source select line; and
    verifying whether threshold voltages of the one or more first source select transistors coupled to the first source select line reach a first target threshold voltage.

6. The method of claim 5, wherein the performing of the second program operation comprises:
    applying a second program voltage to the at least one second source select transistor coupled to the second source select line;
    verifying whether threshold voltages of the at least one second source select transistor coupled to the second source select line reach a second target threshold voltage; and
    increasing a level of the second program voltage by a step voltage according to a verify result.

7. The method of claim 6, wherein the second program voltage has a greater voltage level than the first program voltage.

8. The method of claim 6, wherein the second target threshold voltage has a greater voltage level than the first target threshold voltage.

9. The method of claim 1, wherein a number of first source select transistors is smaller than a number of second source select transistors.

10. The method of claim 1, wherein the programming of the at least one second source select transistor is performed after the programming of the one or more first source select transistors.

11. A memory device, comprising:
    a memory cell array including cell string including a plurality of source select transistors coupled in series to a common source line, at least one drain select transistor coupled to a bit line, and a plurality of memory cells coupled between the at least one drain select transistor and the plurality of source select transistors;
    a peripheral circuit performing a program operation on the plurality of source select transistors; and
    a control logic controlling the peripheral circuit to program one or more first source select transistors, among the plurality of source select transistors, using a fixed program voltage, and to program second source select transistors other than the one or more first source select transistors among the plurality of source select transistors, using an incremental step pulse program (ISPP) method during the program operation,
    wherein threshold voltages of the one or more first source select transistors are maintained during the programming of the second source select transistors.

12. The memory device of claim 11, wherein the first source select transistors are coupled to a first source select line adjacent to the common source line, and
    the second source select transistors are coupled to a second source select line adjacent to the first source select line.

13. The memory device of claim 12, wherein the control logic controls the peripheral circuit to perform a first program operation to program the first source select transistors and a second program operation to program the second source select transistors.

14. The memory device of claim 13, wherein the control logic controls the peripheral circuit to provide a first program voltage having the fixed program voltage to the first source select transistors a predetermined number of times.

15. The memory device of claim 14, wherein the control logic verifies whether threshold voltages of the first source select transistors reach a first target threshold voltage.

16. The memory device of claim 15, wherein the control logic applies a second program voltage to the second source select transistors, verifies whether threshold voltages of the second source select transistors reach a second target threshold voltage, and increases a level of the second program voltage by a predetermined step voltage according to a verify result.

17. The memory device of claim 16, wherein the second program voltage has a greater voltage level than the first program voltage.

18. The memory device of claim 16, wherein the second target threshold voltage has a greater voltage level than the first target threshold voltage.

19. The memory device of claim 12, wherein a number of first source select transistors coupled to the first source select line is smaller than a number of second source select transistors coupled to the second source select line.

20. The memory device of claim 12, wherein the second source select transistors are programmed after the one or more first source select transistors are programmed.

21. The memory device of claim 20, wherein the second source select transistors are connected to the one or more first source select transistors in series.

22. The memory device of claim 21, wherein the second source select transistors are relatively closer to the substrate than the one or more first source select transistors.

23. The method of claim 10, wherein the at least one second source select transistor is connected to the one or more first source select transistors in series.

24. The method of claim 23, wherein the at least one second source select transistor is relatively closer to the substrate than the one or more first source select transistors.

25. A memory device, comprising:
  a memory cell array including a cell string including a plurality of source select transistors coupled in series to a common source line, at least one drain select transistor coupled to a bit line, and a plurality of memory cells coupled between the at least one drain select transistor and the plurality of source select transistors;
  a peripheral circuit performing a program operation on the plurality of source select transistors; and
  a control logic controlling the peripheral circuit to program one or more first source select transistors, among the plurality of source select transistors, using a fixed program voltage, and to program second source select transistors other than the one or more first source select transistors among the plurality of source select transistors, using an incremental step pulse program (ISPP) method during the program operation,
  wherein the fixed program voltage has a lower voltage level than a program voltage applied to the at least one second source select transistor using the incremental step pulse program (ISPP) method.

* * * * *